United States Patent
Watatani

(12) 
(10) Patent No.: US 7,001,847 B2
(45) Date of Patent: Feb. 21, 2006

(54) MICRO PATTERN FORMING METHOD AND SEMICONDUCTOR DEVICE MANUFACTURING METHOD

(75) Inventor: Hirofumi Watatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 153 days.

(21) Appl. No.: 10/685,790

(22) Filed: Oct. 16, 2003

(65) Prior Publication Data

US 2004/0082173 A1 Apr. 29, 2004

(30) Foreign Application Priority Data

Oct. 18, 2002 (JP) ............................. 2002-304015

(51) Int. Cl.
*H01L 21/302* (2006.01)

(52) U.S. Cl. ..................... 438/706; 438/723; 438/725

(58) Field of Classification Search ................ 438/706, 438/710, 714, 719, 720, 723, 724, 725
See application file for complete search history.

(56) References Cited

U.S. PATENT DOCUMENTS

| | | | | |
|---|---|---|---|---|
| 5,643,833 A | * | 7/1997 | Tsukamoto | 438/636 |
| 6,110,758 A | * | 8/2000 | Estrera et al. | 438/93 |
| 6,117,345 A | * | 9/2000 | Liu et al. | 216/19 |
| 6,251,774 B1 | * | 6/2001 | Harada et al. | 438/637 |
| 6,713,234 B1 | * | 3/2004 | Sandhu et al. | 430/313 |

FOREIGN PATENT DOCUMENTS

JP 2000-195791 * 7/2000

* cited by examiner

*Primary Examiner*—Kin-Chan Chen
(74) *Attorney, Agent, or Firm*—Westerman, Hattori, Daniels & Adrian, LLP.

(57) ABSTRACT

A first antireflection film is formed on the surface of an underlying substrate, the first antireflection film suppressing reflection in an absorption mode. A second antireflection film is formed on the first antireflection film, the second antireflection film suppressing reflection in a countervailing interference mode. A cap film is formed on the second antireflection film. A photosensitive resist film is formed on the cap film. A latent image is formed in the photosensitive resist film by exposing the photosensitive resist film to light having a first wavelength. The exposed resist film is developed. Even if the resist film is ashed and resist is again coated, the initial reflectivity lowering effects can be retained.

5 Claims, 9 Drawing Sheets

MICRO PATTERN FORMING METHOD AND SEMICONDUCTOR DEVICE MANUFACTURING METHOD

CROSS REFERENCE TO RELATED APPLICATION

This application is based on and claims priority of Japanese Patent Application No. 2002-304015 filed on Oct. 18, 2002, the entire contents of which are incorporated herein by reference.

BACKGROUND OF THE INVENTION

A) Field of the Invention

The present invention relates generally to a micro pattern forming method and a semiconductor device manufacturing method, and more particularly to a method of forming a micro pattern by forming a photosensitive resist film on an antireflection film and exposing and developing the resist film, and to a method of manufacturing a semiconductor device using micro patterns.

B) Description of the Related Art

With reference to FIGS. 3A to 3C, description will be given on a method of forming a copper wiring line by using a conventional dual damascene method.

As shown in FIG. 3A, copper wiring lines 101 are formed in wiring grooves formed in a surface layer of an interlayer insulating film 100 on a semiconductor substrate. On this interlayer insulating film 100, a diffusion preventing film 102 is formed to prevent diffusion of copper. On this diffusion preventing film 102, an interlayer insulating film 103, an etching stopper film 104, an interlayer insulating film 105 and an antireflection film 106 are stacked in this order. A resist film 107 is formed on the antireflection film 106. The resist film 107 is exposed and developed to form an opening 107a corresponding to a via hole.

As the material of the antireflection film 106, material having an attenuation coefficient k larger than 1 is used. This antireflection film mitigates the influence of a variation in reflection amounts of exposure light from the underlying film, so that the resist film 107 can be patterned with good controllability.

As shown in FIG. 3B, by using the resist film 107 as a mask, the films from the antireflection film 106 to the bottom of the interlayer film 103 are etched to form a via hole 110.

As shown in FIG. 3C, after the resist film 107 is removed, a wiring groove is formed reaching the upper surface of the etching stopper film 104. The diffusion preventing film 102 left on the bottom of the via hole 110 is removed to expose the copper wiring line 101. The wiring groove and via hole 110 is filled in with copper to form a copper wiring pattern.

If the diameter of the via hole 110 is 0.3 $\mu$m or larger, the via hole 110 can be formed by the above-described processes. However, if the diameter of the via hole 110 is smaller than 0.3 $\mu$m, a micro opening for the via hole is difficult to be formed due to a standing wave generated in the resist film 107.

With reference to FIGS. 4A and 4B, an exposure method will be described which is disclosed in Japanese Patent Laid-open Publication No. 2000-195791. The structure from an interlayer insulating film 100 to an antireflection film 106 shown in FIG. 4A is the same as that shown in FIG. 3A. In the conventional structure shown in FIG. 4A, a second antireflection film 120 is formed on the antireflection film 106. As shown in FIG. 4B, a resist film 121 is formed on the second antireflection film 120, exposed and developed.

The first antireflection film 106 is used in an absorption mode. In the absorption mode, exposure light is absorbed so that light scattered by the resist film can be reduced and undesired exposure can be avoided.

The second antireflection film 120 is used in a countervailing interference mode. In the countervailing interference mode, the phase of light reflected on the bottom of an antireflection film is shifted from the phase of light reflected on the top of the antireflection film, so that reflected light returning to the resist film can be reduced.

A lamination of an antireflection film used in the absorption mode and an antireflection film used in the countervailing interference mode can reduce reflected light returning to the resist film, allowing to form a micro pattern.

The related art is published in the JP-A-2000-195791.

In a practical production process, an opening having a desired size is not always formed through patterning a resist film. If the size of an opening after development is different from a design value, the resist film is removed by ashing and resist is again coated.

While the resist film is ashed, the surface layer of the second antireflection film 120 is decomposed by oxidation and the like. As the surface layer of the antireflection film 120 is decomposed, it is not possible to have desired reflectivity lowering effects. An optimum exposure amount becomes different from a design value.

SUMMARY OF THE INVENTION

An object of this invention is to provide a method of forming a micro pattern capable of retaining the initial reflectivity lowering effects even if a resist film is ashed and resist is again coated.

Another object of the invention is to provide a method of manufacturing a semiconductor device by using micro patterns formed by the micro pattern forming method.

According to one aspect of the present invention, there is provided a method of forming a micro pattern comprising steps of: forming a first antireflection film on a surface of an underlying substrate, the first antireflection film suppressing reflection in an absorption mode; forming a second antireflection film on the first antireflection film, the second antireflection film suppressing reflection in a countervailing interference mode; forming a cap film on the second antireflection film; forming a photosensitive resist film on the cap film; forming a latent image in the photosensitive resist film by exposing the photosensitive resist film to light having a first wavelength; and developing the exposed photosensitive resist film.

According to another aspect of the present invention, there is provided a method of manufacturing a semiconductor device comprising steps of: forming an interlayer insulating film on a surface of a substrate having an insulating surface, formed with semiconductor elements, and having a conductive member exposed in a partial area of the insulating surface; forming a first antireflection film having a first attenuation coefficient on the interlayer insulating film; forming a second antireflection film having a second attenuation coefficient smaller than the first attenuation coefficient on the first antireflection film; forming a cap film on the second antireflection film; forming a first photosensitive resist film on the cap film; exposing the first photosensitive resist film to light of a first wavelength, developing the exposed first photosensitive film to form an opening through the first photosensitive resist film; and etching the interlayer insulating film by using the first photosensitive resist film as a mask.

The first and second antireflection films lower the reflectivity, so that a micro opening can be formed through the photosensitive resist film. While the resist film is removed, the cap film protects the upper antireflection film. The reflection preventing effects same as those initially designed can be retained even if the resist film is removed due to exposure failure and a new resist film is again formed, exposed and developed.

As above, by disposing the cap film on the antireflection film in the countervailing interference mode, it becomes possible to prevent decomposition of the antireflection film when the resist film on the cap film is removed. The initial reflection preventing conditions can therefore be retained even if the resist film is removed and re-exposure is performed because of the exposure and development results are insufficient.

DESCRIPTION OF THE PREFERRED EMBODIMENTS

With reference to FIGS. 1A to 1L, description will be given on a method of manufacturing a semiconductor device according to the first embodiment.

Figure 1A:
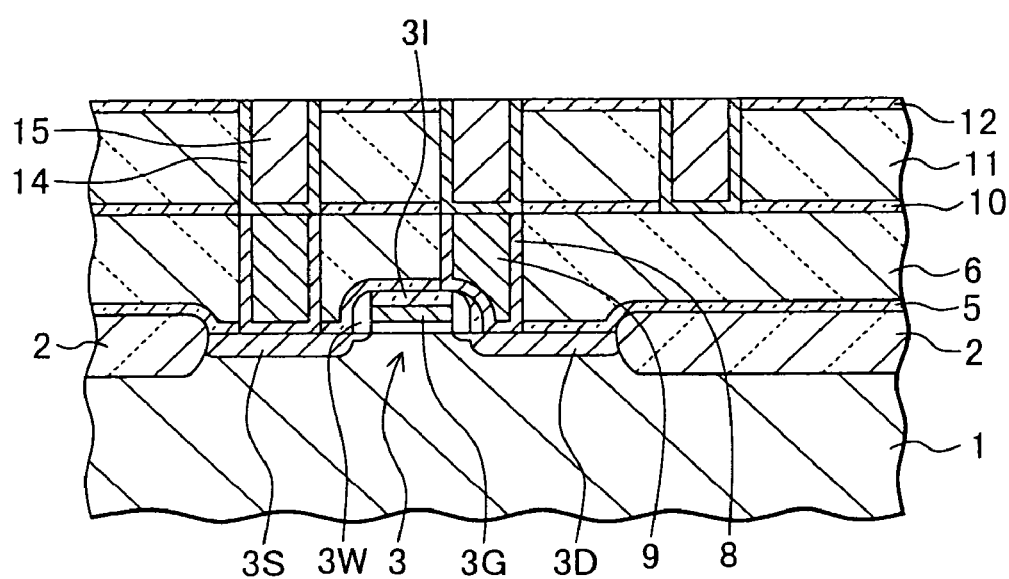
FIGS. 1A to 1L are cross sectional views of a semiconductor device during manufacture, illustrating a semiconductor device manufacturing method according to a first embodiment.

As shown in FIG. 1A, on the surface of a substrate 1 made of silicon, an element separation region 2 is formed by local oxidation of silicon (LOCOS) or shallow trench isolation (STI). In an active region surrounded by the element separation region 2, a MOSFET 3 is formed having a gate electrode 3G, a source region 3S and a drain region 3D. An upper insulating film 3I is formed on the top surface of the gate electrode 3G, and sidewall spacers 3W are formed on the sidewalls of the laminated structure of the gate electrode 3G and upper insulating film 3I. MOSFET 3 is formed by well-known processes such as photolithography, etching, and ion implantation.

An etching stopper film 5 made of silicon nitride (SiN) is formed on the surface of the substrate 1, covering MOSFET 3. An interlayer insulating film 6 made of phosphosilicate glass (PSG) and having a thickness of 700 nm is formed on the etching stopper film 5 by chemical vapor deposition (CVD). Via holes are formed through the interlayer insulating film 6 and etching stopper film at positions corresponding to the source region 3S and drain region 3D. The inner surfaces of the via holes are covered with a barrier metal layer 8 of titanium (Ti), titanium nitride (TiN) or tantalum nitride (TaN), and the inside of each via hole is buried with a tungsten (W) plug 9. The barrier metal layer 8 and tungsten plug 9 can be formed by film deposition and chemical mechanical polishing (CMP).

An etching stopper film 10 of SiC having a thickness of 50 nm, an interlayer insulating film 11 of fluorosilicate glass (FSG) having a thickness of 250 nm and a cap film 12 of silicon oxide having a thickness of 150 nm are formed in this order on the interlayer insulating film 6.

The films from the cap film 12 to the etching stopper film 10 are etched to form wiring grooves which reach the upper surface of the interlayer insulating film 6. The upper surfaces of the tungsten plugs 9 are exposed on the bottoms of the wiring grooves. The inner surface of the wiring groove is covered with a barrier metal layer 14 of TiN or TaN, and copper is filled in the inside of the wiring groove to form a copper wiring pattern. The barrier metal layer 14 and wiring pattern 15 can be formed by film deposition and CMP. With these processes, first layer copper wiring patterns can be formed. At this stage, the insulating regions of the cap film 12 and the conductive regions of the wiring patterns 15 are exposed on the surface of the substrate.

In FIGS. 1B to 1L, the interlayer insulating film 11 and underlying films are drawn in a simplified form.

Figure 1B:
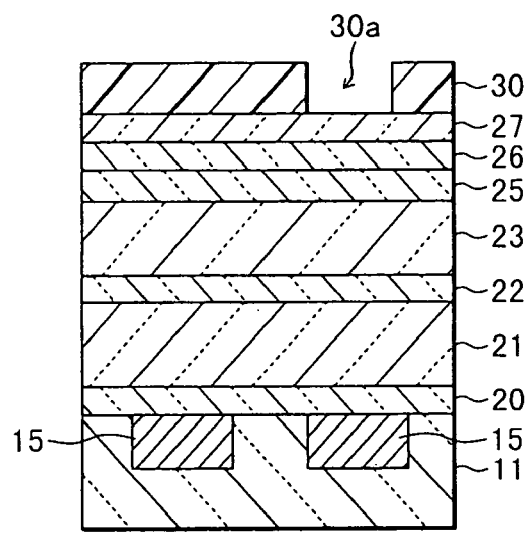

As shown in FIG. 1B, on the first wiring layer including the wiring patterns 15, a diffusion preventing film 20 of SiC having a thickness of 70 nm, an interlayer insulating film 21 of $SiO_2$ having a thickness of 500 nm, an etching stopper film 22 of SiC having a thickness of 70 nm and an interlayer insulating film 23 of $SiO_2$ having a thickness of 400 nm are formed by plasma CVD.

On the interlayer insulating film 23, a lower antireflection film 25 of silicon nitride (SiN) having a thickness of 30 nm is formed by plasma CVD. The lower antireflection film 25 is formed in a plasma vessel at a pressure of about 330 Pa (2.5 Torr) and an input high frequency power of 120 W by flowing silane ($SiH_4$), ammonium ($NH_3$) and nitrogen ($N_2$) gasses at flow rates of 260 sccm, 240 sccm and 900 sccm, respectively. An attenuation coefficient of the SiN film formed under the above-described conditions is about 1.4 at the wavelength of KrF excimer laser.

On the lower antireflection film 25, an upper antireflection film 26 of SiN having a thickness of 20 nm is formed by plasma CVD. The upper antireflection film 26 is formed in the plasma vessel at a pressure of about 470 Pa (3.5 Torr) and an input high frequency power of 100 W by flowing $SiH_4$, $NH_3$ and $N_2$ gasses at flow rates of 155 sccm, 940 sccm and 900 sccm, respectively. An attenuation coefficient of the SiN film formed under the above-described conditions is about 0.6 at the wavelength of KrF excimer laser.

On the upper antireflection film 26, a cap film 27 of $SiO_2$ having a thickness of 10 nm is formed by plasma CVD. The cap film 27 is formed in the plasma vessel at a pressure of about 600 Pa (4.5 Torr) and an input high frequency power of 320 W by flowing $SiH_4$, $N_2O$ and $N_2$ gasses at flow rates of 32 sccm, 480 sccm and 4500 sccm, respectively. An attenuation coefficient of the $SiO_2$ film formed under the above-described conditions is approximately 0 at the wavelength of KrF excimer laser.

KrF resist material is spin coated on the surface of the cap film 27 to form a resist film 30. The resist film 30 is exposed in KrF excimer laser and developed to form an opening 30a for a via hole.

The lower antireflection film 25 prevents reflection of exposure light in the absorption mode, whereas the upper antireflection film 26 prevents reflection of exposure light in the countervailing interference mode. Since the two antireflection films prevent reflection of exposure light, it is possible to alleviate the influence of a variation in reflectivities to be caused by a variation in thicknesses and the like of the films under the antireflection film, and to form a micro opening with good reproductivity.

After the opening 30a is formed in the resist film 30, it is inspected whether the opening 30a has a desired size. If the size of the opening 30a is out of the allowable range, the resist film 30 is ashed by using oxygen plasma to remove it, and resist material is coated, exposed and developed again.

During the removal of the resist film 30, the upper antireflection film 26 is covered with the cap film 27, so that decomposition of the upper antireflection film 26 can be prevented. The initial reflection preventing effects same as those designed can therefore be retained also during re-exposure.

Figure 1C:
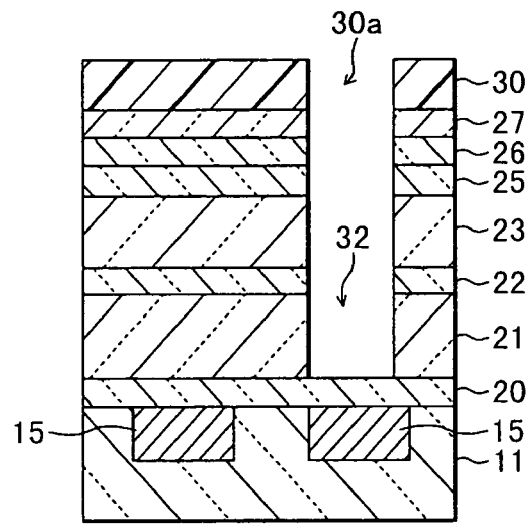

As shown in FIG. 1C, by using the resist film 30 as a mask, a via hole 32 reaching the upper surface of the diffusion preventing film 20 is formed by etching. This etching can be performed by dry etching using $C_4F_6$ as etching gas. The diffusion preventing film 20 functions as an etching stopper film.

Figure 1D:
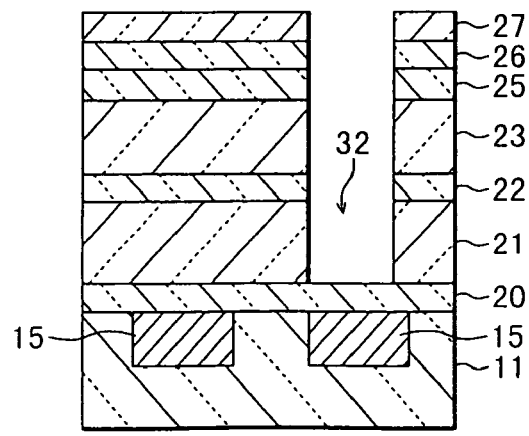

As shown in FIG. 1D, the resist film 30 is ashed to remove it. During this removal, since the cap film 27 protects the upper antireflection film 26, decomposition of the upper antireflection film can be prevented.

Figure 1E:
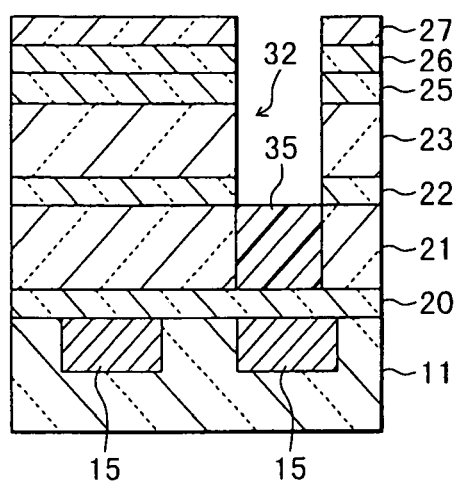

As shown in FIG. 1E, the bottom surface of the via hole 32 is covered with a protective member 35. The protective member 35 can be formed by coating resin such as resist over the whole surface of the substrate and thereafter etching back the resin layer. For example, etching back the resist layer can be performed by using $O_2$ as etching gas. The etch back amount is controlled so that the upper surface of the protective member 35 positions between the diffusion preventing film 20 and etching stopper film 22.

Figure 1F:
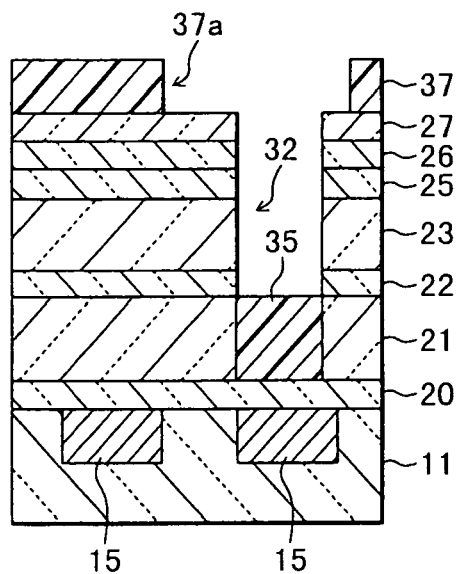

As shown in FIG. 1F, on the cap film 27, KrF resist material is spin coated to form a resist film 37. The resist film is exposed and developed to form an opening 37a corresponding a second layer wiring pattern.

It is inspected whether the width of the opening 37a is in an allowable range. If the width of the opening 37a is out of the allowable range, the resist film 37 and protective member 35 are removed by ashing using oxygen plasma and a wet-based post-process. For example, ammonium fluoride is used as wet-based post-process liquid. Thereafter, again the protective member 35 is formed and the resist film 37 is exposed and developed. Also in this case, since the upper antireflection film 26 is covered with the cap film 27, the reflection preventing effects same as those designed can be retained also during re-exposure.

Figure 1G:
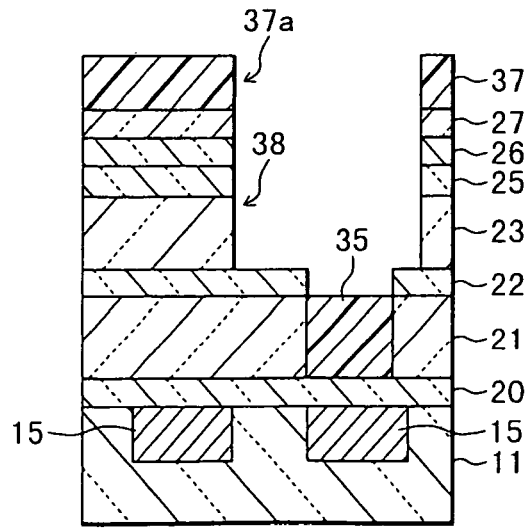
Figure 1H:
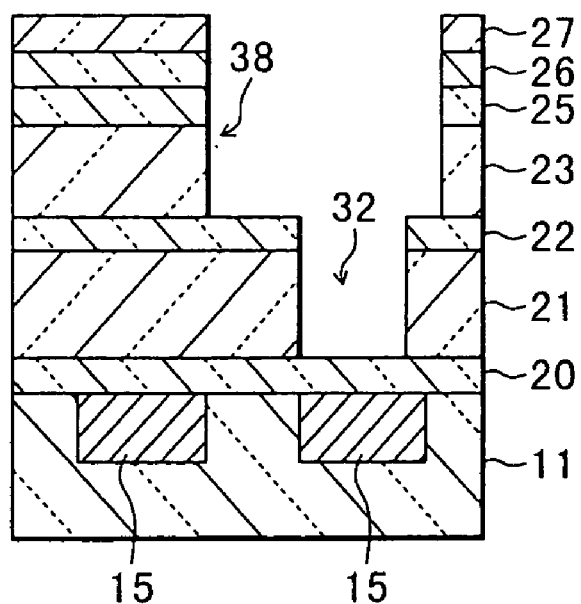

As shown in FIG. 1G, by using the resist film 37 as a mask, a wiring groove 38 reaching the upper surface of the etching stopper film 22 is formed by etching. This etching can be performed by dry etching using $C_4F_6$ as etching gas. Since the etching stopper film 22 exists, the depth of the wiring groove 38 can be easily controlled. Since the protective member 35 buried in the via hole 32 protects the wiring pattern 15, it is possible to prevent the first layer wiring pattern 15 from being damaged while the wiring groove 38 is formed. As shown in FIG. 1H, the resist film 37 covering the surface of the cap film 27 and the protective member 35 are ashed by using oxygen plasma to remove them.

Figure 1I:
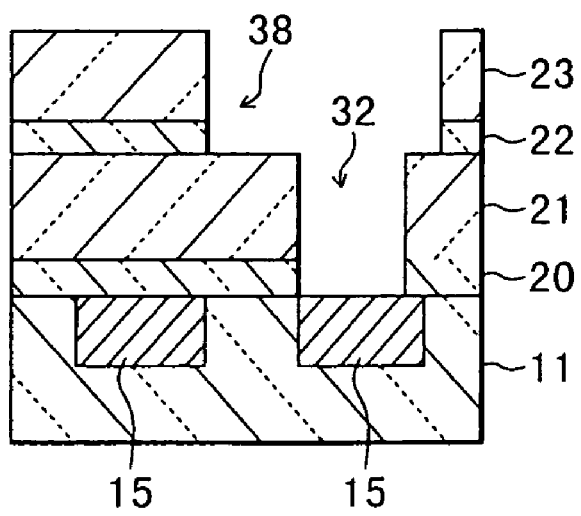

As shown in FIG. 1I, the diffusion preventing film 20 left on the bottom of the via hole 32 is removed to expose the first layer wiring pattern 15. The diffusion preventing film 20 can be dry etched by using $C_4H_6$. At this time, the etching stopper film 22 exposed on the bottom of the wiring groove 38 is also removed.

The lower antireflection film 25, upper antireflection film 26 and cap film 27 over the interlayer insulating film 23 are removed by dry etching using $C_4F_6$.

Figure 1J:
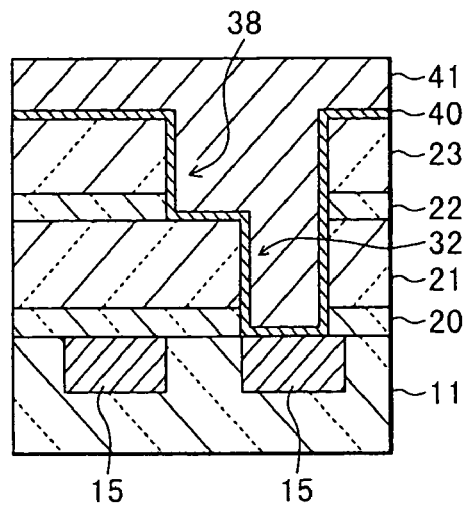

As shown in FIG. 1J, a barrier metal layer 40 of tantalum (Ta) is formed to a thickness of 20 nm by sputtering, the barrier metal layer covering the inner surface of the via hole 32, the inner surface of the wiring groove 38 and the upper surface of the interlayer insulating film 23. Thereafter, a copper seed layer is formed and then copper plating is performed. A copper film 41 is therefore formed burying the insides of the via hole 32 and wiring groove 38.

Figure 1K:
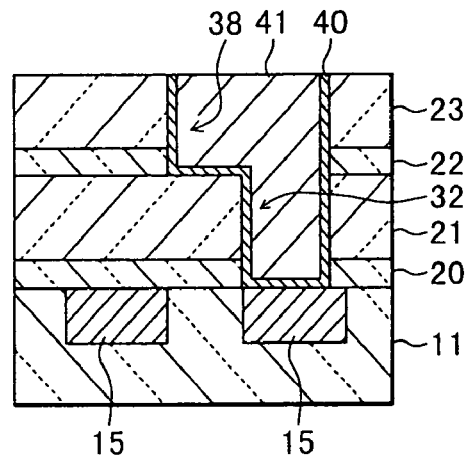
Figure 1L:
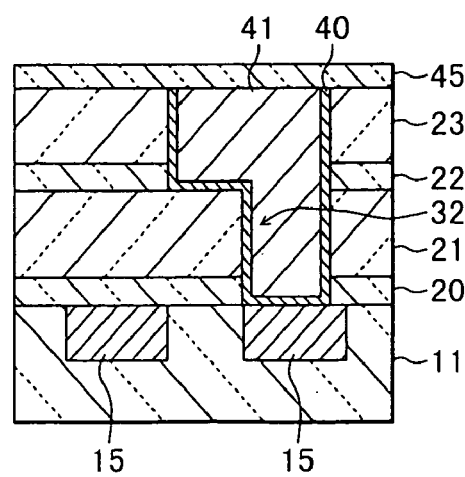

As shown in FIG. 1K, an unnecessary copper film 41 and barrier metal layer 40 are removed by CMP to leave the wiring pattern 41 only in the via hole 32 and wiring groove 38. As shown in FIG. 1L, a diffusion preventing film 45 of SiC is formed on the second wiring layer including the wiring pattern 41. Wiring layers of the third and succeeding layers can be formed by a method similar to the method of forming the second wiring layer.

In the first embodiment described above, the cap film 27 is disposed on the upper antireflection film 26. Therefore, decomposition of the upper antireflection film 26 can be prevented during re-exposure after the resist film once formed is removed by ashing. The reflection preventing effects same as those designed can therefore be retained also during re-exposure.

The cap film 27 is preferably made of material whose optical constant is hard to be changed even in the ashing environment of a resist film. For example, it is preferable to use the material having an attenuation coefficient smaller than that of the upper antireflection film 26. Ideally, it is preferable to use the material whose attenuation coefficient is approximately 0 at the wavelength of exposure light. Such materials include SiN and SiC in addition to $SiO_2$. In the first embodiment, the antireflection films 25 and 26 are made of SiN having attenuation coefficients of 1.4 and 0.6, respectively. By adjusting the film forming conditions, the attenuation coefficient of SiN can be set to approximately 0.

In the first embodiment described above, although the diffusion preventing film 20 and etching stopper film 22 are made of SiC, other materials may be used which provide a sufficient etching selection ratio relative to the interlayer insulating films 21 and 23. For example, SiN or the like may be used. The interlayer insulating films 21 and 23 may be made of inorganic low dielectric constant material such as FSG and SiOC or organic low dielectric constant material such as SiLK (trademark of the Dow Chemical Company).

The etching stopper 22 inserted between the interlayer insulating films 21 and 23 may be omitted. In this case, when the wiring groove 38 shown in FIG. 1G is formed, the depth of the wiring groove 38 is controlled on the basis of an etching time.

In the first embodiment described above, although the antireflection films 25 and 26 are made of SiN, other materials may be used. The lower antireflection film 25 is preferably made of the material having an attenuation coefficient of 1 or higher in order to retain the reflectivity lowering effects in the absorption mode. The upper antireflection film 26 is preferably made of the material having an attenuation coefficient of 0.9 or lower in order to retain the reflectivity lowering effects in the countervailing interference effects.

The lower and upper antireflection films may be made of amorphous carbon and the cap film may be made of $SiO_2$, SiN or SiC. The lower and upper antireflection films may be made of SiN and the cap film may be made of $SiO_2$, SiN or SiC. The lower and upper antireflection films may be made of silicon oxynitride (SiON) and the cap film may be made of $SiO_2$, SiN or SiC. Even if the lower and upper antireflection films and cap film are made of the same material, the attenuation coefficients of these films can be set to desired values by controlling the conditions of forming these films.

In the first embodiment, irrespective of whether or not re-exposure is performed on the basis of the inspection results of exposure and development, after the via hole 32 shown in FIG. 1C is formed, the resist film 30 is removed and the resist film 37 for forming the wiring groove 38 shown in FIG. 1G is exposed. Therefore, irrespective of whether re-exposure due to exposure failure is performed, the effects of the cap film 27 can be expected if copper wiring patterns are formed by the dual damascene method of the first embodiment.

In the first embodiment, although a copper wiring pattern is formed by the dual damascene method, the first layer copper wiring pattern 15 shown in FIG. 1A may be formed by the single damascene method. In this case, the lower and upper antireflection films 25 and 26 and cap film 27 of the first embodiment are also applicable.

Next, with reference to FIGS. 2A to 2E, a semiconductor device manufacturing method according to the second embodiment will be described.

Figure 2A:
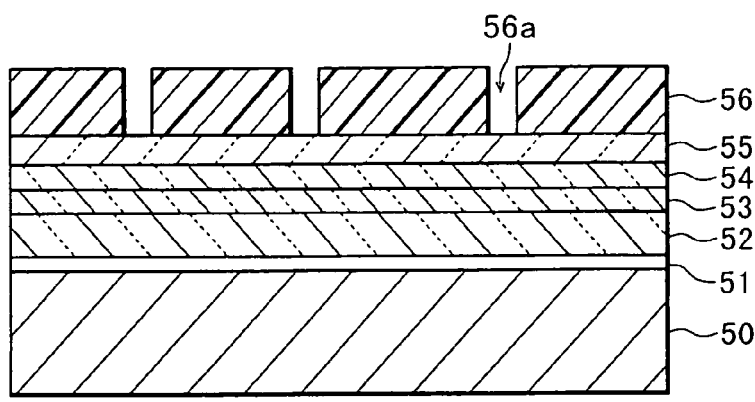
FIGS. 2A to 2E are cross sectional views of a semiconductor device during manufacture, illustrating a semiconductor device manufacturing method according to a second embodiment.

As shown in FIG. 2A, on the surface of a semiconductor substrate 50 of silicon, a liner film 51 of $SiO_2$ having a thickness of 10 nm is formed by thermal oxidation. On the liner film 51, a mask film 52 of SiN having a thickness of 100 nm is formed by CVD.

Sequentially formed on the mask film 52 are a lower antireflection film 53 of amorphous carbon having an attenuation coefficient of 1.4 and a thickness of 30 nm, an upper antireflection film 54 of amorphous carbon having an attenuation coefficient of 0.6, and a cap film 55 of $SiO_2$ having an attenuation coefficient of substantially 0. On the cap film 55, a resist film 56 is formed for ArF excimer laser. The resist film 56 is exposed and developed to form an opening 56a corresponding to an element separation insulating region to be formed. The attenuation coefficients of the lower antireflection film 53 and upper antireflection film 54 are at the wavelength of 198 nm of ArF excimer laser.

If the opening 56a having a desired size is not formed, the resist film 56 is ashed to remove it, and again a resist film is formed, exposed and developed. In this case, the cap film 55 protects the upper antireflection film 54, so that the optical constant of the upper antireflection film 54 can be maintained in the initial conditions. The reflection preventing effects same as those designed can therefore be retained also during re-exposure.

Figure 2B:
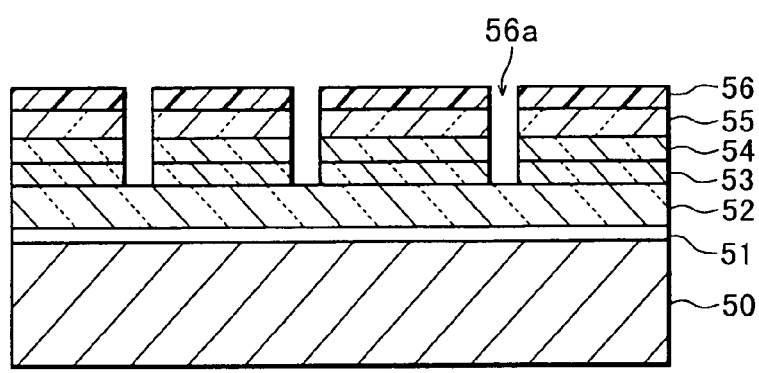

As shown in FIG. 2B, by using the resist film 56 as a mask, three layers, from the cap film 55 to the lower antireflection film 53 are dry etched. During this etching, the surface layer of the resist film 56 is etched and the resist film becomes thinner. The left resist film 56 is removed.

Figure 2C:
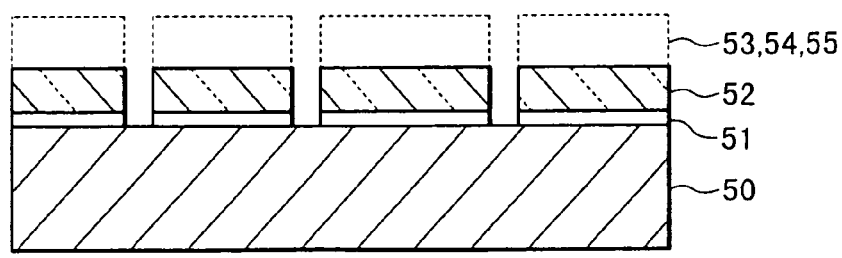

As shown in FIG. 2C, by using the antireflection films 53 and 54 and cap film 55 as a mask, the mask film 52 and liner film 51 are etched. Even if the etching selection ratio between the resist film for ArF excimer laser and SiN film is small, the mask film 52 under the antireflection film can be patterned by using the antireflection films 53 and 54 and cap film 55 as a hard mask.

Figure 2D:
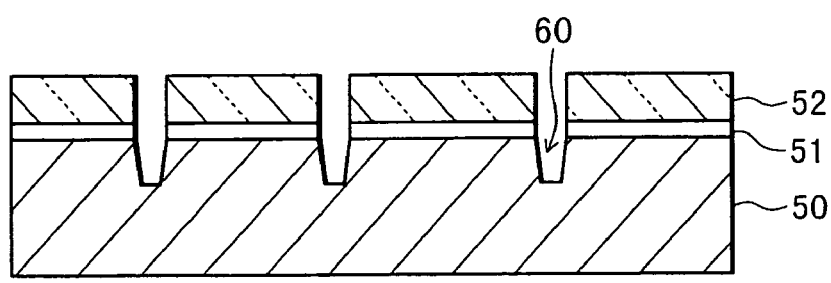

As shown in FIG. 2D, by using the mask film 52 as a mask, the surface layer of the semiconductor substrate 50 is etched to form a shallow trench 60.

Figure 2E:
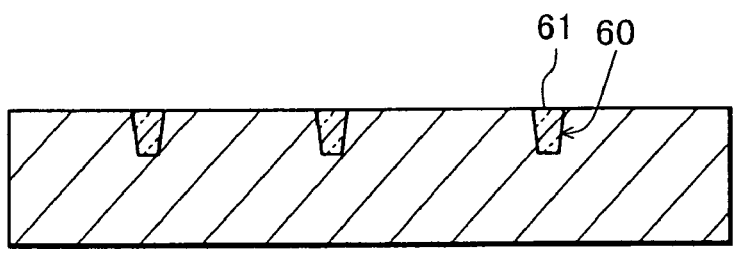
Figure 3A:
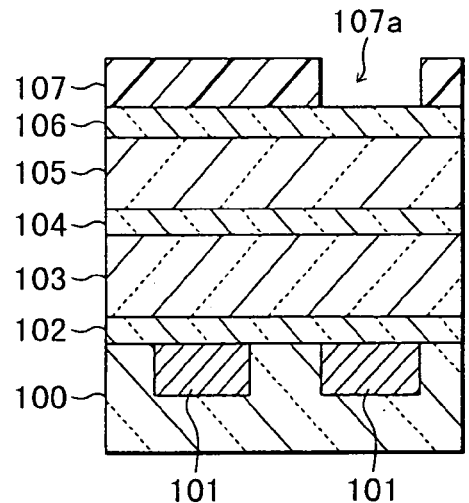
FIGS. 3A to 3C are cross sectional view of a semiconductor device during manufacture, illustrating a conventional semiconductor device manufacturing method.
Figure 3B:
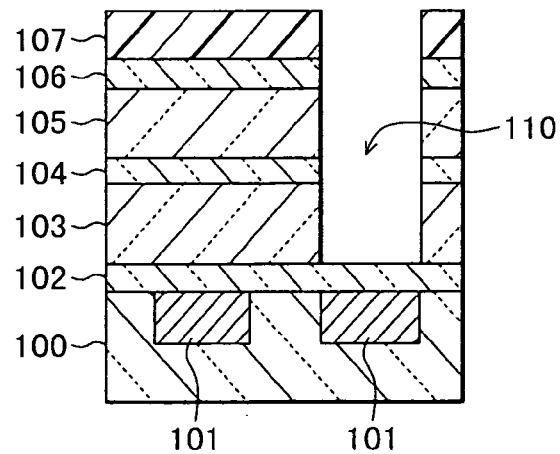
Figure 3C:
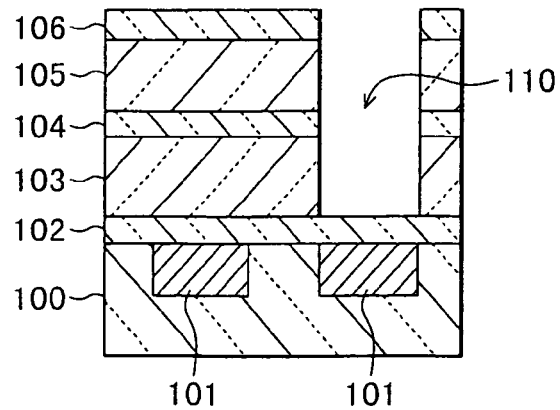
Figure 4A:
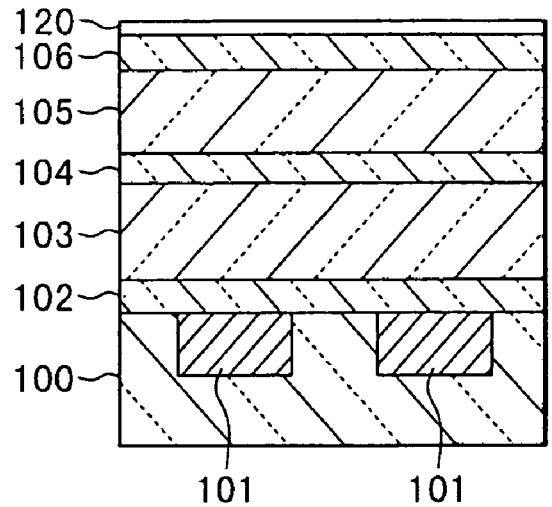
FIGS. 4A and 4B are cross sectional view of a semiconductor device during manufacture, illustrating another conventional semiconductor device manufacturing method.
Figure 4B:
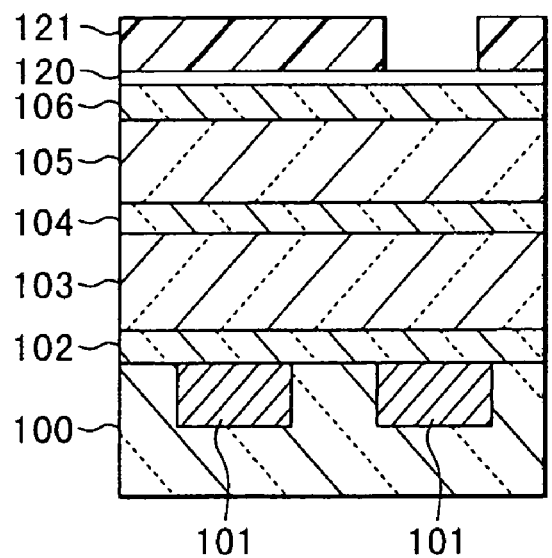

As shown in FIG. 2E, the mask film 52 and liner film 51 are removed. A silicon oxide film is deposited burying the shallow trench 60 and CMP is preformed to leave an element separation insulating film 61 of $SiO_2$ in the shallow trench 60.

In the first embodiment, the description has been given on the exposure and development processes for forming copper wiring patterns by the damascene method. In the second embodiment, the description has been given on the exposure and development processes for forming a trench for shallow trench isolation. The three-layer structure used by these embodiments, the lower and upper antireflection films and cap film, are also applicable to other exposure and development processes, such as the exposure and development processes for forming a gate electrode.

The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device comprising steps of:
    forming an interlayer insulating film on a surface of a substrate having an insulating surface, formed with semiconductor elements, and having a conductive member exposed in a partial area of the insulating surface;
    forming a first antireflection film on the interlayer insulating film, the first antireflection film suppressing reflection in an absorption mode;
    forming a second antireflection film on the first antireflection film, the second antireflection film suppressing reflection in a countervailing interference mode;
    forming a cap film on the second antireflection film;
    forming a first photosensitive resist film on the cap film;
    exposing the first photosensitive resist film to light of a first wavelength, developing the exposed film to form an opening through the first photosensitive resist film, the opening corresponding to a via hole for connecting a wiring pattern to be formed on the interlayer insulating film to the conductive member;
    etching the interlayer insulating film to form the via hole by using the first photosensitive resist film as a mask;
    removing the first photosensitive resist film;
    forming a second photosensitive resist film on the cap film;
    exposing the second photosensitive resist film to light of the first wavelength, developing the exposed film to form an opening through the second photosensitive resist film, the opening corresponding to the wiring pattern to be formed on the interlayer insulating film;
    etching the interlayer insulating film to form a wiring groove by using the second photosensitive resist film as a mask, the wiring groove reaching a midst of the interlayer insulating film in a thickness direction thereof;
    removing the second photosensitive resist film; deepening the via hole until the conductive member is exposed if the conductive member is not exposed on a bottom of the via hole; and
    burying an inside of the via hole and the wiring groove with a conductive wiring material.

2. A method of manufacturing a semiconductor device according to claim 1, wherein an attenuation coefficient of the cap film at the first wavelength is smaller than an attenuation coefficient of the second antireflection film at the first wavelength.

3. A method of manufacturing a semiconductor device according to claim 1, wherein an attenuation coefficient of the cap film at the first wavelength is 0.

4. A method of manufacturing a semiconductor device according to claim 1, wherein an attenuation coefficient of the first antireflection film is 1 or higher at the first wavelength.

5. A method of manufacturing a semiconductor device according to claim 1, wherein an attenuation coefficient of the second antireflection film is 0.9 or lower at the first wavelength.

* * * * *